(12) United States Patent
Kim et al.

(10) Patent No.: US 7,866,058 B2
(45) Date of Patent: Jan. 11, 2011

(54) SPIN HEAD AND SUBSTRATE TREATING METHOD USING THE SAME

(75) Inventors: Hyun Jong Kim, Cheonan-shi (KR); Ju Won Kim, Cheonan-shi (KR); Jung Keun Cho, Seoul (KR)

(73) Assignee: Semes Co., Ltd., Chungcheongnam-do (KR)

( * ) Notice: Subject to any disclaimer, the term of this patent is extended or adjusted under 35 U.S.C. 154(b) by 664 days.

(21) Appl. No.: 11/896,144

(22) Filed: Aug. 30, 2007

(65) Prior Publication Data

US 2008/0052948 A1 Mar. 6, 2008

(30) Foreign Application Priority Data

Aug. 30, 2006 (KR) .................. 10-2006-0082800

(51) Int. Cl.
*F26B 11/02* (2006.01)
(52) U.S. Cl. ............... 34/381; 34/78; 34/80; 414/217; 118/313; 134/200
(58) Field of Classification Search .......... 34/77, 34/78, 80, 3, 381; 414/217; 134/200; 118/313
See application file for complete search history.

(56) References Cited

U.S. PATENT DOCUMENTS

| | | | | |
|---|---|---|---|---|
| 3,862,856 | A | * | 1/1975 | Shipman .................. 438/760 |
| 4,001,659 | A | * | 1/1977 | Shipman .................. 318/119 |
| 4,280,442 | A | * | 7/1981 | Johnson .................. 118/52 |
| 4,439,261 | A | * | 3/1984 | Pavone et al. ......... 156/345.47 |
| 4,457,419 | A | * | 7/1984 | Ogami et al. ............ 198/345.1 |
| 4,473,455 | A | * | 9/1984 | Dean et al. ............. 204/298.15 |
| 4,489,740 | A | * | 12/1984 | Rattan et al. ............ 134/140 |
| 4,585,337 | A | * | 4/1986 | Phillips ................... 355/45 |
| 4,788,994 | A | | 12/1988 | Shinbara |
| 4,855,775 | A | * | 8/1989 | Matsuoka ............... 396/627 |

(Continued)

FOREIGN PATENT DOCUMENTS

JP 54136304 A * 10/1979

(Continued)

OTHER PUBLICATIONS

English translation of claim 1 of KR 10-0052334 B1; Korean Patent No. 10-0052334 B1 is the granted patent for Korean Publication No. 1988-0003411.

*Primary Examiner*—Stephen M. Gravini
(74) *Attorney, Agent, or Firm*—Harness, Dickey & Pierce, P.L.C.

(57) ABSTRACT

A spin head includes a rotatable plate, first chucking pins and second chucking pins for supporting a edge portion of a substrate loaded on the plate, and a driving unit for selectively driving the first and second chucking pins. The driving unit includes a first magnet connected to the first chucking pin and disposed at a first height, a second magnet connected to the second chucking pin and disposed at a second height, and a driving magnet for driving the first and second magnets. The driving magnet is elevated by means of an elevating member to selectively apply a magnetic force to the first or second magnet and moves in the radius outside direction of the first or second chucking pin due to a magnetic force.

15 Claims, 13 Drawing Sheets

U.S. PATENT DOCUMENTS

| | | | | |
|---|---|---|---|---|
| 4,898,639 A * | 2/1990 | Moe et al. | 156/345.55 |
| 4,944,860 A * | 7/1990 | Bramhall et al. | 204/298.23 |
| 4,960,142 A * | 10/1990 | Robb et al. | 134/138 |
| 5,032,217 A * | 7/1991 | Tanaka | 216/91 |
| 5,076,877 A * | 12/1991 | Ueda et al. | 156/345.55 |
| 5,156,174 A * | 10/1992 | Thompson et al. | 134/153 |
| 5,168,886 A * | 12/1992 | Thompson et al. | 134/153 |
| 5,168,887 A * | 12/1992 | Thompson et al. | 134/153 |
| 5,203,360 A * | 4/1993 | Nguyen et al. | 134/78 |
| 5,222,310 A * | 6/1993 | Thompson et al. | 34/202 |
| 5,224,504 A * | 7/1993 | Thompson et al. | 134/155 |
| 5,238,500 A * | 8/1993 | Bergman | 134/3 |
| 5,349,978 A * | 9/1994 | Sago et al. | 134/153 |
| 5,357,991 A * | 10/1994 | Bergman et al. | 134/102.1 |
| 5,365,031 A * | 11/1994 | Mumola | 219/121.43 |
| 5,375,291 A * | 12/1994 | Tateyama et al. | 15/302 |
| 5,376,216 A * | 12/1994 | Yoshioka et al. | 156/345.55 |
| 5,421,056 A * | 6/1995 | Tateyama et al. | 15/302 |
| 5,431,421 A * | 7/1995 | Thompson et al. | 279/139 |
| 5,445,172 A * | 8/1995 | Thompson et al. | 134/153 |
| 5,503,590 A * | 4/1996 | Saitoh et al. | 451/11 |
| 5,513,668 A * | 5/1996 | Sumnitsch | 134/157 |
| 5,520,743 A * | 5/1996 | Takahashi | 118/730 |
| 5,555,902 A * | 9/1996 | Menon | 134/199 |
| 5,562,113 A * | 10/1996 | Thompson et al. | 134/95.2 |
| 5,573,023 A * | 11/1996 | Thompson et al. | 134/66 |
| 5,591,262 A * | 1/1997 | Sago et al. | 118/52 |
| 5,706,843 A * | 1/1998 | Matsuo | 134/153 |
| 5,738,128 A * | 4/1998 | Thompson et al. | 134/95.2 |
| 5,753,133 A * | 5/1998 | Wong et al. | 216/67 |
| 5,845,662 A * | 12/1998 | Sumnitsch | 134/153 |
| 5,857,475 A * | 1/1999 | Volk | 134/153 |
| 5,861,061 A * | 1/1999 | Hayes et al. | 118/52 |
| 5,863,340 A * | 1/1999 | Flanigan | 118/728 |
| 5,879,576 A * | 3/1999 | Wada et al. | 216/91 |
| 5,895,549 A * | 4/1999 | Goto et al. | 156/345.51 |
| 5,954,072 A * | 9/1999 | Matusita | 134/149 |
| 5,954,911 A * | 9/1999 | Bergman et al. | 156/345.29 |
| 5,966,635 A * | 10/1999 | Hiatt et al. | 438/795 |
| 5,966,765 A * | 10/1999 | Hamada et al. | 15/77 |
| 5,972,127 A * | 10/1999 | Thompson et al. | 134/33 |
| 5,989,342 A | 11/1999 | Ikeda et al. | |
| 6,062,239 A * | 5/2000 | Bexten | 134/25.4 |
| 6,125,863 A * | 10/2000 | Bexten | 134/95.2 |
| 6,140,253 A * | 10/2000 | Hayes et al. | 438/782 |
| 6,159,288 A * | 12/2000 | Satou et al. | 118/70 |
| 6,167,893 B1 * | 1/2001 | Taatjes et al. | 134/147 |
| 6,168,660 B1 * | 1/2001 | Hayes et al. | 118/52 |
| 6,178,361 B1 * | 1/2001 | George et al. | 700/213 |
| 6,182,675 B1 * | 2/2001 | Naka et al. | 134/61 |
| 6,217,034 B1 * | 4/2001 | Smedt et al. | 279/106 |
| 6,252,842 B1 * | 6/2001 | Mukawa | 720/712 |
| 6,273,104 B1 * | 8/2001 | Shinbara et al. | 134/25.4 |
| 6,317,406 B1 * | 11/2001 | Konig et al. | 720/710 |
| 6,334,266 B1 * | 1/2002 | Moritz et al. | 34/337 |
| 6,337,003 B1 * | 1/2002 | Kinokiri et al. | 204/298.15 |
| 6,357,457 B1 * | 3/2002 | Taniyama et al. | 134/57 R |
| 6,368,049 B1 * | 4/2002 | Osaka et al. | 414/783 |
| 6,374,508 B1 * | 4/2002 | Yudovsky et al. | 33/645 |
| 6,391,110 B1 * | 5/2002 | Satou et al. | 118/52 |
| 6,398,879 B1 * | 6/2002 | Satou et al. | 134/33 |
| 6,417,117 B1 * | 7/2002 | Davis | 438/782 |
| 6,432,214 B2 * | 8/2002 | Bryer et al. | 134/10 |
| 6,452,298 B1 * | 9/2002 | Fukuda et al. | 310/89 |
| 6,462,903 B1 * | 10/2002 | Yamada et al. | 360/99.12 |
| 6,497,239 B2 * | 12/2002 | Farmer et al. | 134/56 R |
| 6,511,540 B1 * | 1/2003 | Davis | 118/52 |
| 6,516,815 B1 * | 2/2003 | Stevens et al. | 134/25.4 |
| 6,527,031 B1 * | 3/2003 | Yanagita et al. | 156/584 |
| 6,536,454 B2 * | 3/2003 | Lindner | 134/153 |
| 6,537,416 B1 * | 3/2003 | Mayer et al. | 156/345.17 |
| 6,599,571 B2 * | 7/2003 | Davis | 427/240 |
| 6,599,815 B1 * | 7/2003 | Yang | 438/471 |
| 6,612,014 B1 * | 9/2003 | Donoso et al. | 29/559 |
| 6,645,344 B2 * | 11/2003 | Caldwell et al. | 156/345.53 |
| 6,686,597 B2 * | 2/2004 | Kumasaka et al. | 250/492.2 |
| 6,702,302 B2 * | 3/2004 | Smedt et al. | 279/106 |
| 6,708,701 B2 * | 3/2004 | Emami | 134/148 |
| 6,712,926 B2 * | 3/2004 | Chiang et al. | 156/345.18 |
| 6,722,642 B1 * | 4/2004 | Sutton et al. | 269/21 |
| 6,736,149 B2 * | 5/2004 | Biberger et al. | 134/66 |
| 6,748,960 B1 * | 6/2004 | Biberger et al. | 134/61 |
| 6,767,176 B2 * | 7/2004 | Yudovsky et al. | 414/672 |
| 6,770,146 B2 * | 8/2004 | Koren et al. | 118/730 |
| 6,770,149 B2 * | 8/2004 | Satou et al. | 134/10 |
| 6,770,565 B2 * | 8/2004 | Olgado et al. | 438/706 |
| 6,786,996 B2 * | 9/2004 | Emami | 156/345.1 |
| 6,807,972 B2 * | 10/2004 | Chiu et al. | 134/94.1 |
| 6,810,888 B2 * | 11/2004 | Tsuchiya et al. | 134/104.2 |
| 6,811,618 B2 * | 11/2004 | Kuroda | 134/33 |
| 6,824,343 B2 * | 11/2004 | Kurita et al. | 414/217 |
| 6,824,612 B2 * | 11/2004 | Stevens et al. | 118/52 |
| 6,827,092 B1 * | 12/2004 | Smith et al. | 134/149 |
| 6,863,735 B1 * | 3/2005 | Nakahara et al. | 118/730 |
| 6,871,656 B2 * | 3/2005 | Mullee | 134/103.1 |
| 6,913,651 B2 * | 7/2005 | Ivanov et al. | 118/320 |
| 6,921,456 B2 * | 7/2005 | Biberger et al. | 156/345.26 |
| 6,921,466 B2 * | 7/2005 | Hongo et al. | 204/198 |
| 6,926,012 B2 * | 8/2005 | Biberger et al. | 134/1.3 |
| 6,926,798 B2 * | 8/2005 | Biberger et al. | 156/345.31 |
| 6,935,638 B2 * | 8/2005 | Ivanov et al. | 279/106 |
| 6,939,403 B2 * | 9/2005 | Ivanov et al. | 118/52 |
| 6,964,724 B2 * | 11/2005 | Yamasaki et al. | 156/345.21 |
| 6,967,174 B1 * | 11/2005 | Mayer et al. | 438/748 |
| 7,001,468 B1 * | 2/2006 | Sheydayi | 118/733 |
| 7,021,635 B2 * | 4/2006 | Sheydayi | 279/3 |
| 7,032,287 B1 * | 4/2006 | Spady et al. | 29/559 |
| 7,053,386 B1 * | 5/2006 | Holtam et al. | 250/492.21 |
| 7,060,422 B2 * | 6/2006 | Biberger et al. | 430/329 |
| 7,077,917 B2 * | 7/2006 | Jones | 134/34 |
| 7,087,122 B2 * | 8/2006 | Smith et al. | 134/33 |
| 7,094,291 B2 * | 8/2006 | Reardon et al. | 118/313 |
| 7,117,790 B2 * | 10/2006 | Kendale et al. | 101/327 |
| 7,138,016 B2 * | 11/2006 | Reardon et al. | 118/313 |
| 7,140,393 B2 * | 11/2006 | Sheydayi | 137/875 |
| 7,163,380 B2 * | 1/2007 | Jones | 417/44.1 |
| 7,166,184 B2 * | 1/2007 | Nakamura et al. | 156/345.22 |
| 7,186,093 B2 * | 3/2007 | Goshi | 417/53 |
| 7,225,820 B2 * | 6/2007 | Jones | 134/200 |
| 7,241,372 B2 * | 7/2007 | Sendai et al. | 205/80 |
| 7,250,374 B2 * | 7/2007 | Gale et al. | 438/745 |
| 7,255,772 B2 * | 8/2007 | Biberger et al. | 156/345.26 |
| 7,270,137 B2 * | 9/2007 | Yokomizo | 134/186 |
| 7,284,760 B2 * | 10/2007 | Siebert et al. | 279/4.12 |
| 7,291,565 B2 * | 11/2007 | Hansen et al. | 438/745 |
| 7,307,019 B2 * | 12/2007 | Kawamura et al. | 438/689 |
| 7,354,481 B2 * | 4/2008 | Okuno et al. | 118/503 |
| 7,357,842 B2 * | 4/2008 | Ishikawa et al. | 118/503 |
| 7,380,984 B2 * | 6/2008 | Wuester | 374/148 |
| 7,387,868 B2 * | 6/2008 | Jacobson et al. | 430/313 |
| 7,399,713 B2 * | 7/2008 | Aegerter et al. | 438/745 |
| 7,429,537 B2 * | 9/2008 | Aegerter et al. | 438/745 |
| 7,434,590 B2 * | 10/2008 | Sheydayi | 134/200 |
| 7,435,447 B2 * | 10/2008 | Parent | 427/345 |
| 7,478,720 B2 * | 1/2009 | Bernhard et al. | 198/346.1 |
| 7,491,036 B2 * | 2/2009 | Parent et al. | 417/153 |
| 7,494,107 B2 * | 2/2009 | Sheydayi et al. | 251/63.5 |
| 7,518,288 B2 * | 4/2009 | Bran | 310/328 |
| 7,520,939 B2 * | 4/2009 | Ho et al. | 134/26 |
| 7,524,383 B2 * | 4/2009 | Parent et al. | 148/243 |
| 7,651,306 B2 * | 1/2010 | Rice et al. | 414/217 |
| 7,651,723 B2 * | 1/2010 | Ivanov et al. | 427/96.1 |
| 7,744,730 B2 * | 6/2010 | Mullapudi et al. | 204/192.12 |

| | | | | |
|---|---|---|---|---|
| 2008/0052948 A1 * | 3/2008 | Kim et al. .................... 34/317 | JP | 06315860 A * 11/1994 |
| | | | JP | 9107023 A 4/1997 |
| | FOREIGN PATENT DOCUMENTS | | JP | 9232410 A 9/1997 |
| | | | JP | 2000349139 A * 12/2000 |
| JP | 60263371 A * | 12/1985 | JP | 2001332486 A * 11/2001 |
| JP | 62185321 A * | 8/1987 | JP | 2004241492 A 8/2004 |
| JP | 62264128 A * | 11/1987 | JP | 2006205264 A * 8/2006 |
| JP | 63191535 A * | 8/1988 | JP | 2008060579 A * 3/2008 |
| JP | 01055739 A * | 3/1989 | JP | 2008310947 A * 12/2008 |
| JP | 02260144 A * | 10/1990 | KR | 1998-0003411 5/1988 |
| JP | 02267729 A * | 11/1990 | KR | 92-00673 1/1992 |
| JP | 2283021 A | 11/1990 | KR | 2001-0108984 12/2001 |
| JP | 03165316 A * | 7/1991 | WO | WO 9419508 A1 * 9/1994 |
| JP | 03187020 A * | 8/1991 | | |
| JP | 04074789 A * | 3/1992 | * cited by examiner | |
| JP | 4-59155 | 5/1992 | | |

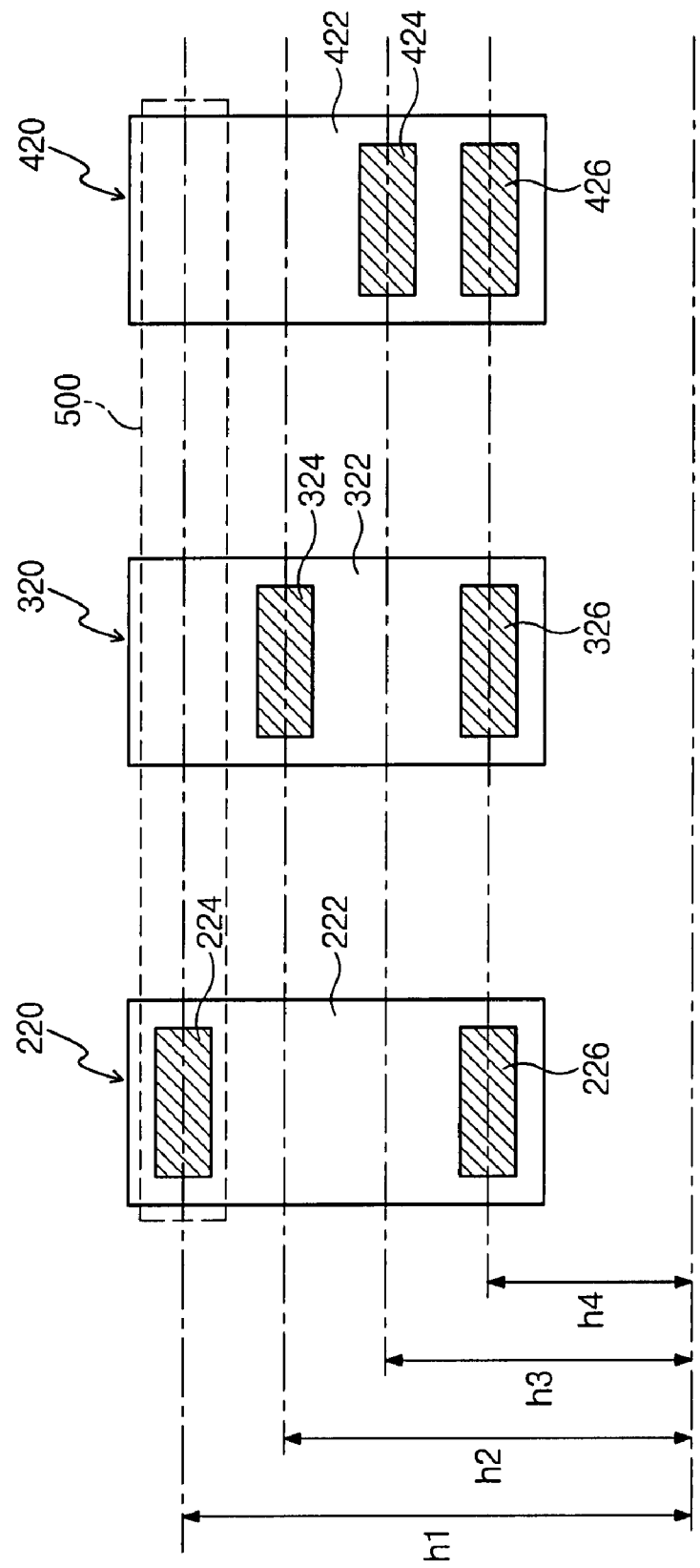

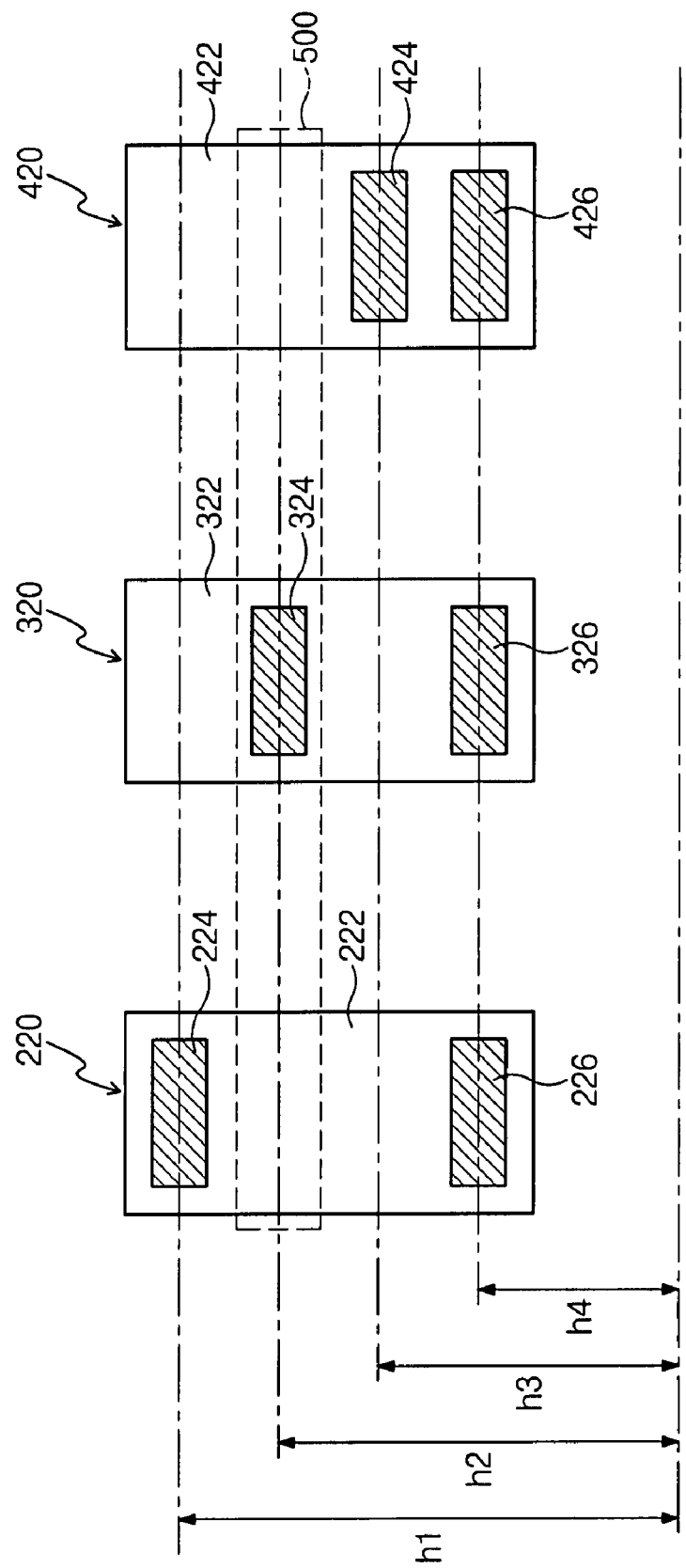

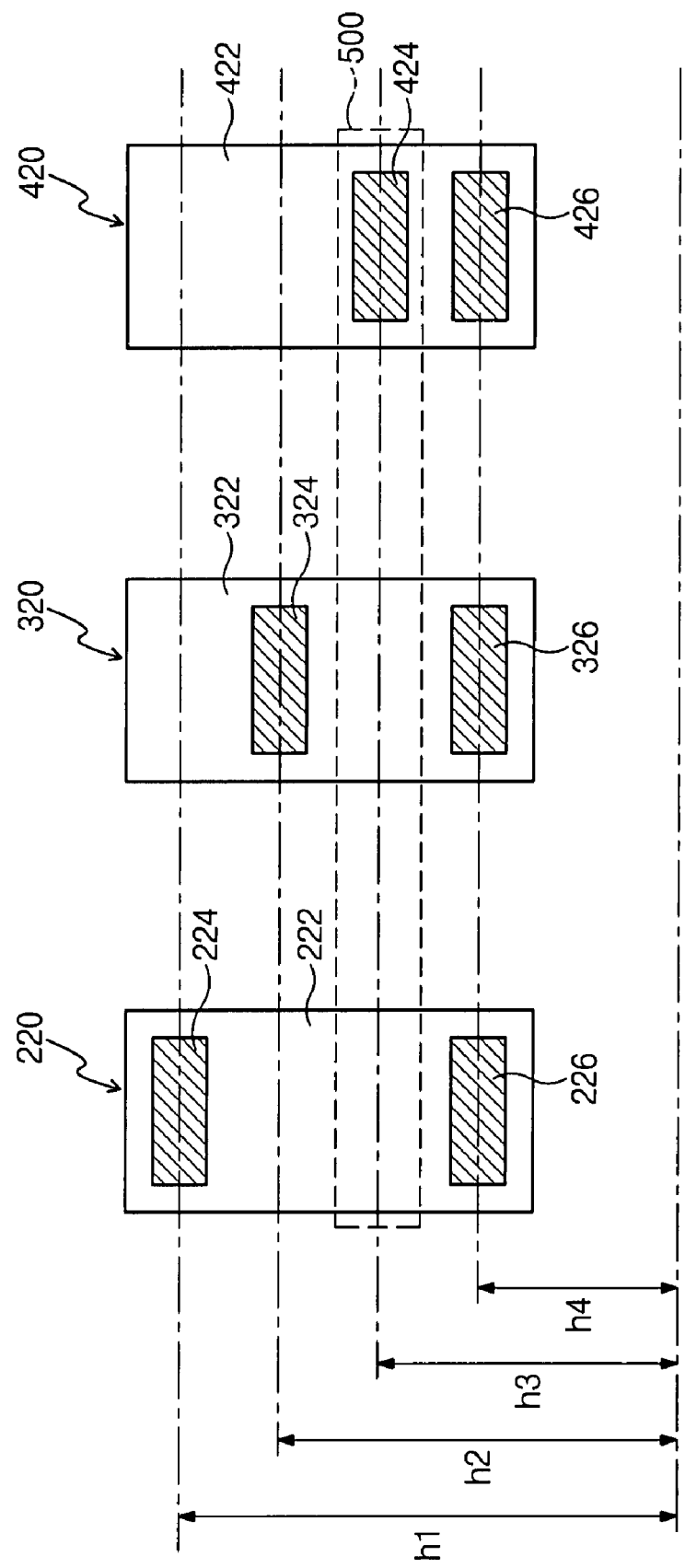

SPIN HEAD AND SUBSTRATE TREATING METHOD USING THE SAME

CROSS-REFERENCE TO RELATED APPLICATIONS

This U. S non-provisional patent application claims priority under 35 U.S.C §119 of Korean Patent Application 2006-82800 filed on Aug. 30, 2006, the entirety of which is hereby incorporated by reference.

BACKGROUND

The present invention relates to a spin head and a substrate treating method using the same. More specifically, the present invention is directed to a spin head provided to remove chemicals remaining at a contact portion of a substrate held by a chucking pin during a process and a substrate treating method using the spin head.

Through a variety of processes, desired patterns are formed on a substrate such as a semiconductor substrate, a glass substrate or liquid crystal panel. In etching and cleaning processes, a wafer spins to remove residues or thin films thereon. While spinning a substrate such as a wafer at thousands of RPM, deionized water (DI water) or etching solution or cleaning solution is supplied. Undoubtedly, the substrate spinning operation has been identically applied to not only a cleaning process but also other semiconductor manufacturing processes such as a photoresist process.

Generally, there are two methods of holding a wafer. One is that the rear surface of a wafer is vacuum-adsorbed to hold the wafer, and the other is that the edge of a wafer is mechanically fixed by means of a support member from the edge of the wafer to hold the wafer. In the latter method, the support member continues to contact and support the same portion of the wafer at the same position until a process is ended. Even after the process ends, chemicals may remain at a contact surface between the support member and the wafer and around there. The remaining chemicals may be hardened or left as debris to contaminate the wafer or peripheral components during the subsequent processes.

SUMMARY OF THE INVENTION

Exemplary embodiments of the present invention are directed to a spin head. In an exemplary embodiment, the spin head may include: a rotatable support plate; first chucking pins and second chucking pins installed on a top surface of the support plate and supporting a edge portion of a substrate to prevent the substrate loaded on the support plate from separating from the support plate when the support plate rotates; and a driving unit for selectively moving the first and second chucking pins in the radius outside direction of the support plate by means of a magnetic force such that the first and second chucking pins are not in contact with the edge portion of the substrate during a process.

In another exemplary embodiment, the spin head may include: a rotatable plate; first chucking pins, second chucking pins, and third chucking pins installed on a top surface of the support plate and supporting a edge portion of a substrate to prevent the substrate loaded on the support plate from separating from the support plate when the support plate is rotated; and a driving unit for moving the first to third chucking pins in a radius direction of the support plate such that the first to third chucking pins are in contact with or not in contact with the edge portion of the substrate, wherein the driving unit allows one of the first to third chucking pins not to be in contact with the edge portion of the substrate by means of a magnetic force.

Exemplary embodiments of the present invention are directed to a substrate treating method performed by providing a spin head comprising first and second chucking pins for supporting a edge portion of a substrate loaded on a support plate and a driving unit for moving the first and second chucking pins in a radius direction of the support plate and supplying a treating solution to the substrate loaded on the spin head. In an exemplary embodiment, the substrate treating method may include: a first step in which a driving magnet of the driving unit is elevated to apply a magnetic force to first magnets connected to the first chucking pins respectively, and the first chucking pins are spaced apart from the edge portion of the substrate by the magnetic force; and a second step in which the driving magnet is elevated to apply a magnetic force to a second magnet connected to the respective second chucking pins, and the second chucking pins are spaced apart from the edge portion of the substrate by the magnetic force, wherein the first magnet is disposed at a first height and the second magnet is disposed at a second height that is different from the first height, and the first step and the second step are alternately repeated by the elevation of the driving magnet.

In another exemplary embodiment, the substrate treating method may include: supporting a edge portion of a substrate loaded on a support plate by means of first chucking pins, second chucking pins, and third chucking pins during a process, wherein one selected from the first to third chucking pins is not in contact with the edge portion of the substrate and the others are in contact therewith, and one chucking pin not being in contact with the edge portion of the substrate is alternately selected.

BRIEF DESCRIPTION OF THE DRAWINGS

FIGS. 5A-8B illustrate the state where first to third chucking pins are driven by means of a driving unit according to the present invention.

DETAILED DESCRIPTION OF PREFERRED EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
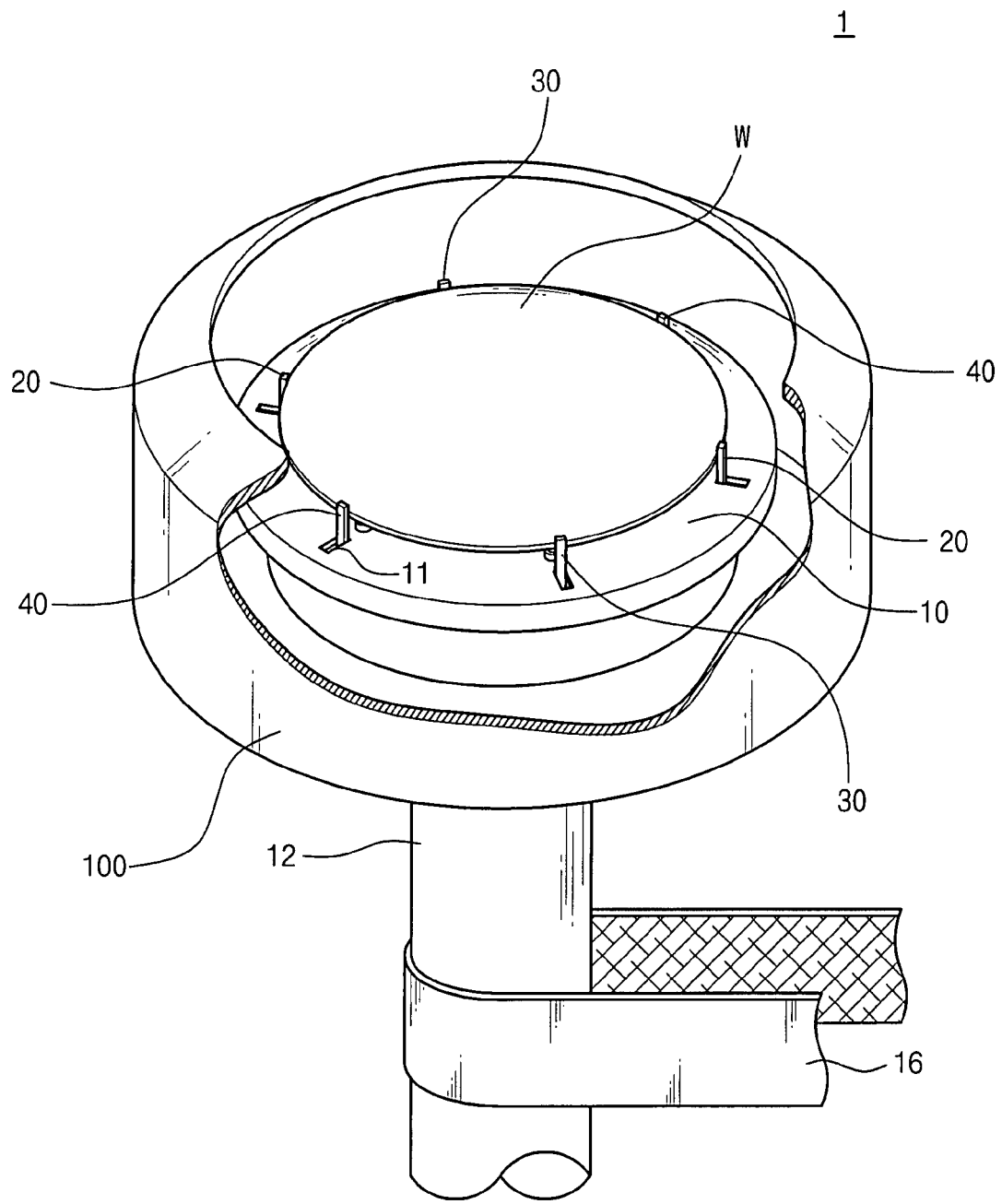
FIG. 1 is a perspective view of a substrate treating apparatus according to the present invention.

FIG. 1 illustrates a substrate treating apparatus 1 according to the present invention. The substrate treating apparatus 1 includes a plate 10, a container 100 configured to cover the plate 10, and first chucking pins 20, second chucking pins 30, and third chucking pins 40 installed on a top surface of the plate 10.

The plate 10 exhibits the shape of a disk corresponding to a wafer W and is located below the wafer W during a process. A plurality of through-holes 11 are formed at the top of the plate 10. The chucking pins 20, 30, and 40 are installed at their holes 11, respectively.

A rotation shaft 12 is connected to the bottom of the plate 10 to rotate the plate 10. The rotation shaft 12 is rotated by means of a belt 16 connecting a driving motor (not shown) to a driving pulley (not shown), which is to spin the wafer W during a process. When the rotation shaft 12 is rotated by means of the belt 16, the plate 10 connected to the rotation shaft 12 is also rotated to spin the wafer W loaded on the plate 10.

The container 100 is provided to prevent chemicals remaining on the top surface of the wafer W from scattering to the outside during the rotation of the plate 10. An aperture is formed at the top of the container 100. The wafer W is loaded on the plate 10 or unloaded from the plate 10 through the aperture.

As described above, the chucking pins 20, 30, and 40 are installed at their through-holes 11 formed at the plate 10, respectively. These chucking pins 20, 30, and 40 are provided together to support the wafer W loaded on the plate 10. In this embodiment, six through-holes 11 are formed and six chucking pins 20, 30, and 40 are provided correspond to the six through-holes 11, respectively. That is, two first chucking pins 20 are provided to correspond to two through-holes 11, respectively; two second chucking pins 30 are provided to correspond to two through-holes 11, respectively; and two third chucking pins 40 are provided to correspond to two through-holes 11, respectively. These chucking pins 20, 30, and 40 are movable within their through-holes 11 in a radius direction of the plate 10, respectively.

The wafer W should be safely supported by means of the chucking pins 20, 30, and 40 during a process. Accordingly, the chucking pins 20, 30, and 40 are disposed equiangularly or others.

Figure 3:
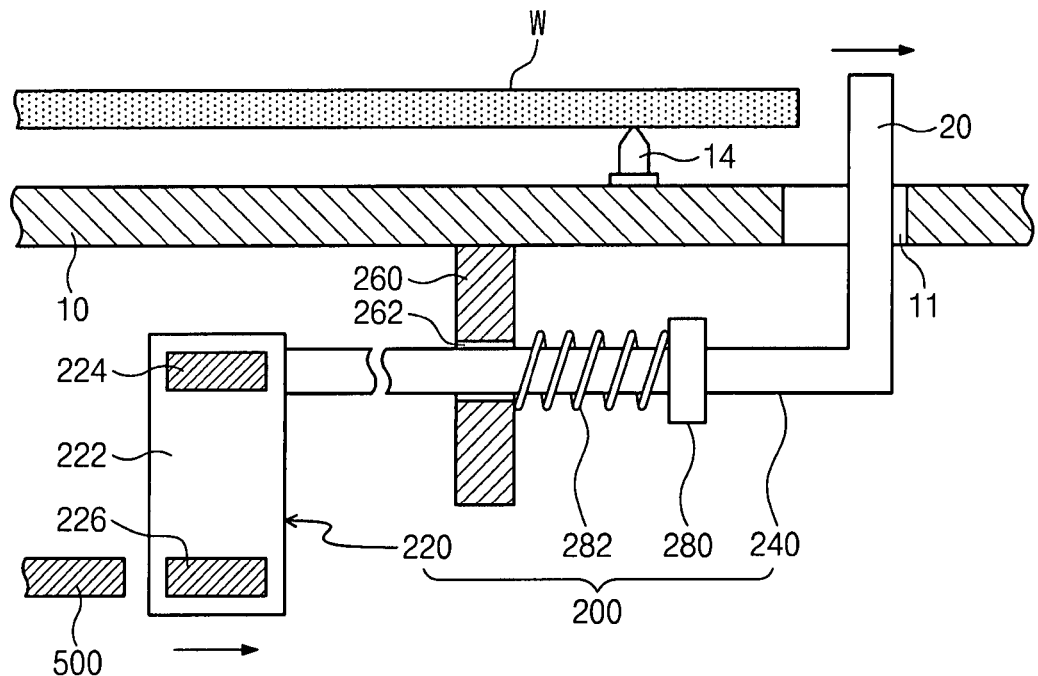
FIG. 3 illustrates a first follower part according to the present invention.

As illustrated in FIG. 3, a support pin 40 is installed on the top surface of the plate 10 to support the bottom surface of the wafer W loaded on the plate 10.

Figure 2:
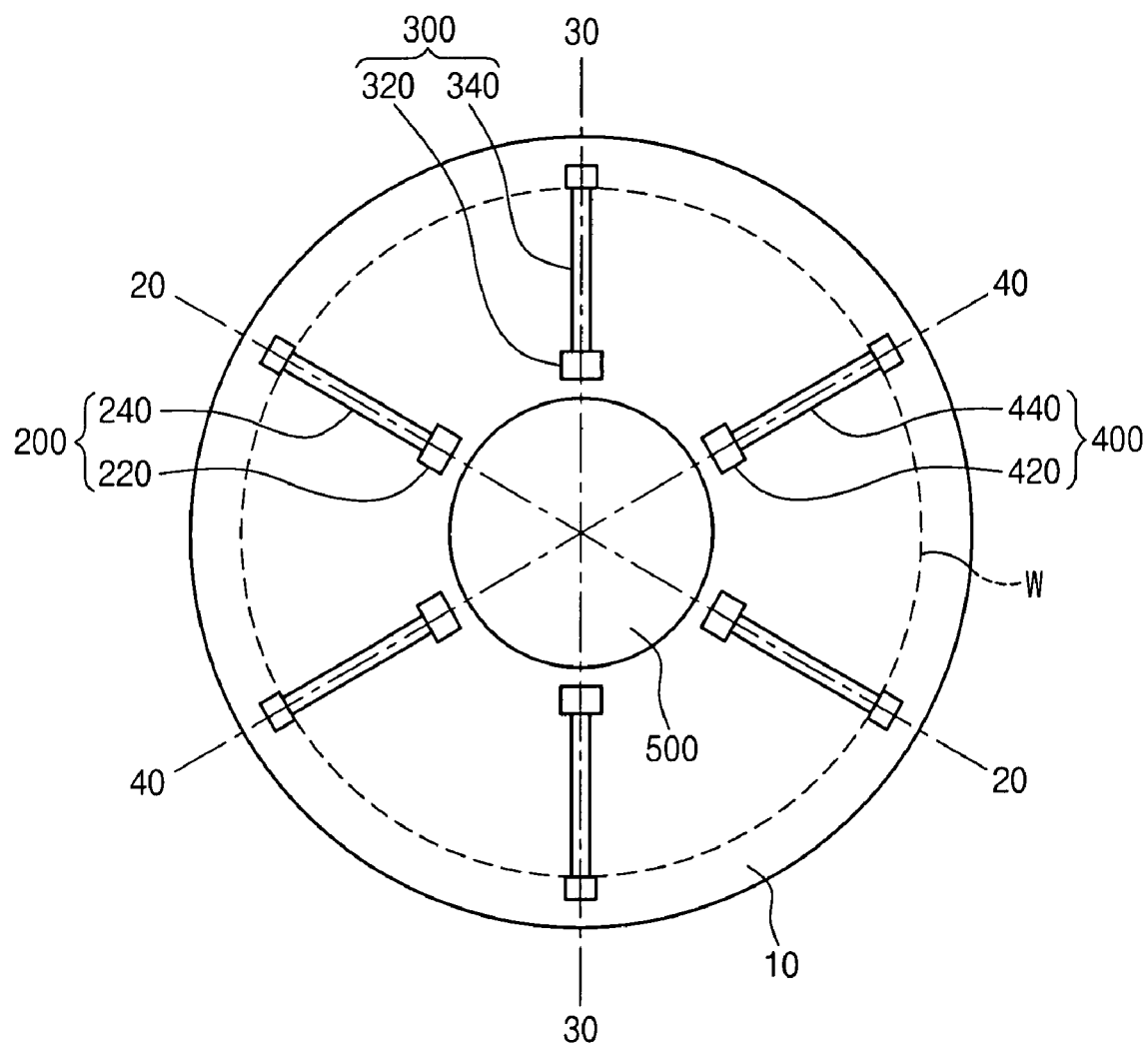
FIG. 2 is a top plan view of a driving unit according to the present invention.
Figure 4:
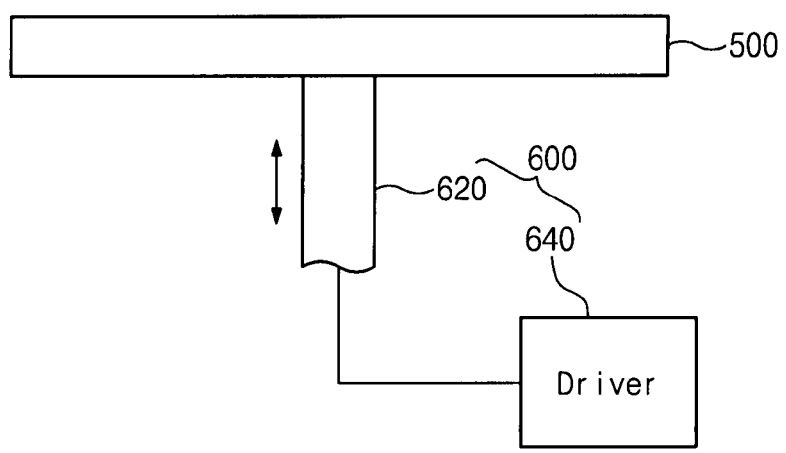
FIG. 4 illustrates a driving magnet and an elevating member according to the present invention.

FIG. 2 is a top plan view of a driving unit according to the present invention, and FIG. 3 illustrates a first follower part 200 according to the present invention. FIG. 4 illustrates a driving magnet 500 and an elevating member 600 according to the present invention.

The driving unit includes a first follower part 200 connected to a first chucking pin 20, a second follower part 300 connected to a second chucking pin 30, a third follower part 400 connected to a third chucking pin 40, and a driving magnet 500 configured to drive the first to third follower parts 200, 300, and 400. The driving unit allows the first to third chucking pins 20, 30, and 40 to make a straight reciprocating motion in a radius direction of the support plate 10.

The first follower part 200 includes a first follower 220 disposed to be opposite to the driving magnet 500 and a first follower rod 24o connecting the first chucking pin 20 to the first follower 220. Similarly, the second follower part 300 includes a second follower 320 and a second follower rod 340, and the third follower part 400 includes a third follower 420 and a third follower rod 440.

As illustrated in FIG. 2, a disk-shaped deriving magnet 500 is disposed inside the first to third followers 220, 320, and 420. The driving magnet 500 is elevated by means of an elevating the elevating member 600. Due to the elevation of the driving magnet 500, a magnetic force is applied to one of these followers 220, 320, and 420. The magnetic-force-received one of these followers 220, 320, and 420 travels in the radius direction of the support plate 10. At this point, a chucking pin connected to the magnetic-force-received follower also travels, which will be described in detail later.

As illustrated in FIG. 4, the elevating member 600 includes a support shaft 620 connected to the bottom of the driving magnet 500 and a driver 640 configured to drive the support shaft 620. The driving magnet 500 is elevated with the support shaft 620 by means of the driver 640.

As illustrated in FIG. 3, the first follower 220 includes a first housing 222, a first magnet 224, and a first sub-magnet 226. The first housing 222 is provided to offer a space in which the first magnet 224 and the first sub-magnet 226 are accommodated. The first magnet 224 is disposed at the uppermost portion, and the first sub-magnet 226 is disposed at the lowermost portion.

One side of the first magnet 224 and the first sub-magnet 226 disposed in opposition to the driving magnet 500 has the same polarity as the outer side of the driving magnet 500 disposed in opposition to the first magnet 224 and the first sub-magnet 226. Thus, when a magnetic force is applied to the first magnet 224 and the first sub-magnet 226 due to the elevation of the driving magnet 500, a repulsive force is generated between the driving magnet 500 and the first magnet 224 or between the driving magnet 500 and the first sub-magnet 226. The repulsive force allows the first follower 220 and the first chucking pin 20 to travel in an outside direction of the support plate 10.

One end of the first follower rod 240 is connected to the first follower 220, and the other end thereof is connected to the bottom of the first chucking pin 20. Accordingly, when a magnetic force is applied by means of the driving magnet 500, the first follower 220 travels in the radius direction of the support plate 10 and the first chucking pin 20 connected to the first follower 220 by the first follower rod 240 also travels.

The first follower 200 includes a first bush 260, which perpendicularly extends downwardly from the rear surface of the support plate 10. A first guide hole 262 is formed at the first bush 260 to penetrate in the radius direction of the support plate 10. The follower rod 240 is inserted into the first guide hole 262. The first guide hole 262 is provided to guide the travel direction of the first follower rod 240 such that the first follower rod 240 travels in the radius direction of the support plate 10.

A first fixture 280 is installed on the first follower rod 240 and disposed between the first bush 260 and the first chucking pin 20. The first fixture 280 protrudes toward the outer side from the outer circumferential surface of the first follower rod 240.

A first elastic substance 282 is provided between the first bush 260 and the first fixture 280. One end of the first elastic substance 282 is fixed to the first bush 260, and the other end thereof is fixed to the first fixture 280. The first elastic substance 282 is an extension spring, which applies an elastic force in the radius inside direction of the support plate 10. Thus, the first fixture 280 receives the elastic force in the radius inside direction of the support plate 10 and the first chucking pin 20 is maintained to come in contact with a edge portion of the wafer W when an external force is not applied.

Each of the second and third follower parts 300 and 400 has the same configuration as the first follower part 200. Therefore, the first and second follower parts 300 and 400 will not be described in further detail.

Figure 9:
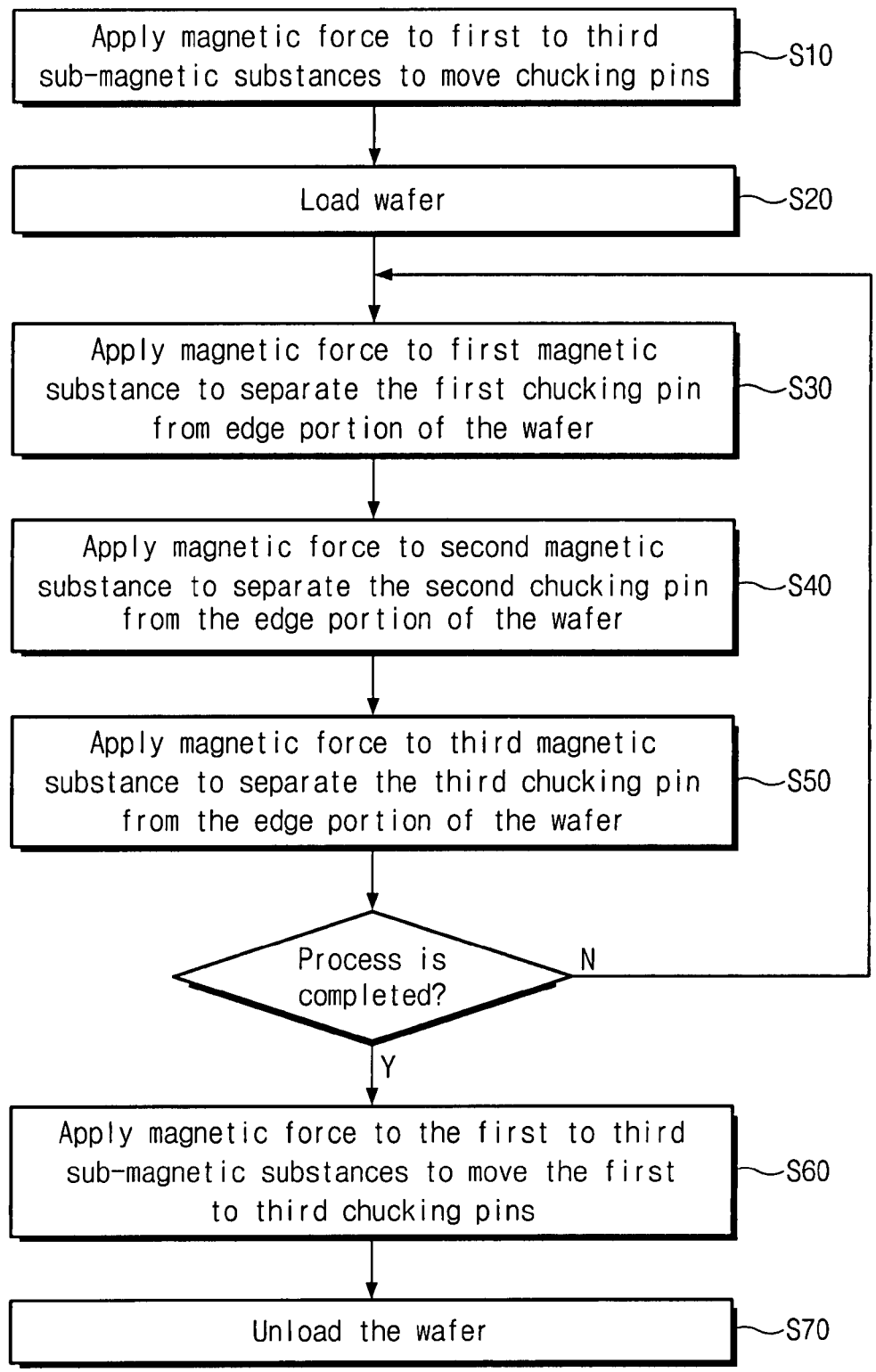
FIG. 9 is a flowchart illustrating a substrate treating method according to the present invention.

FIGS. 5A-8B illustrate the state where first to third chucking pins 20, 30, and 40 are driven by means of the driving unit according to the present invention. FIG. 9 is a flowchart illustrating a substrate treating method according to the present invention. The substrate treating method will now be described below with reference to FIGS. 5A-8B and FIG. 9.

Figure 5A:
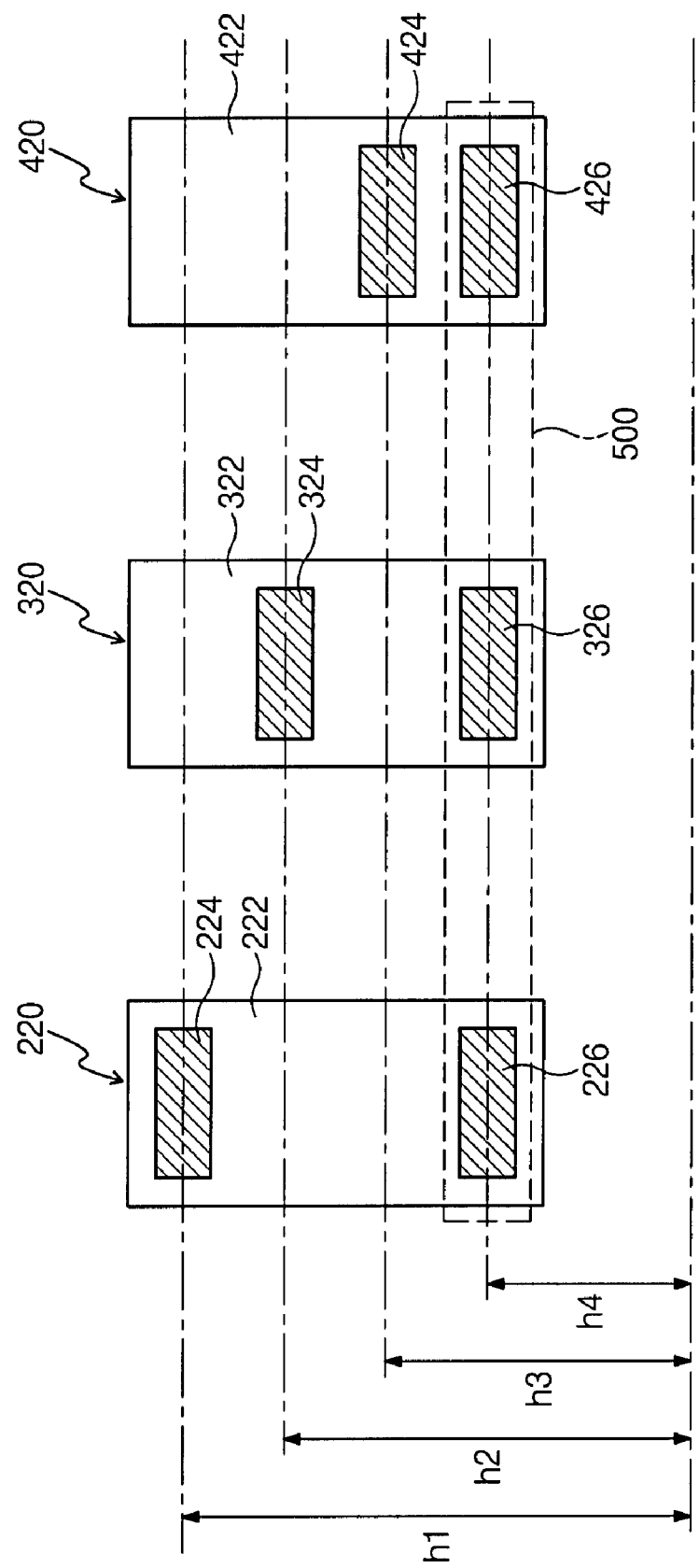
Figure 5B:
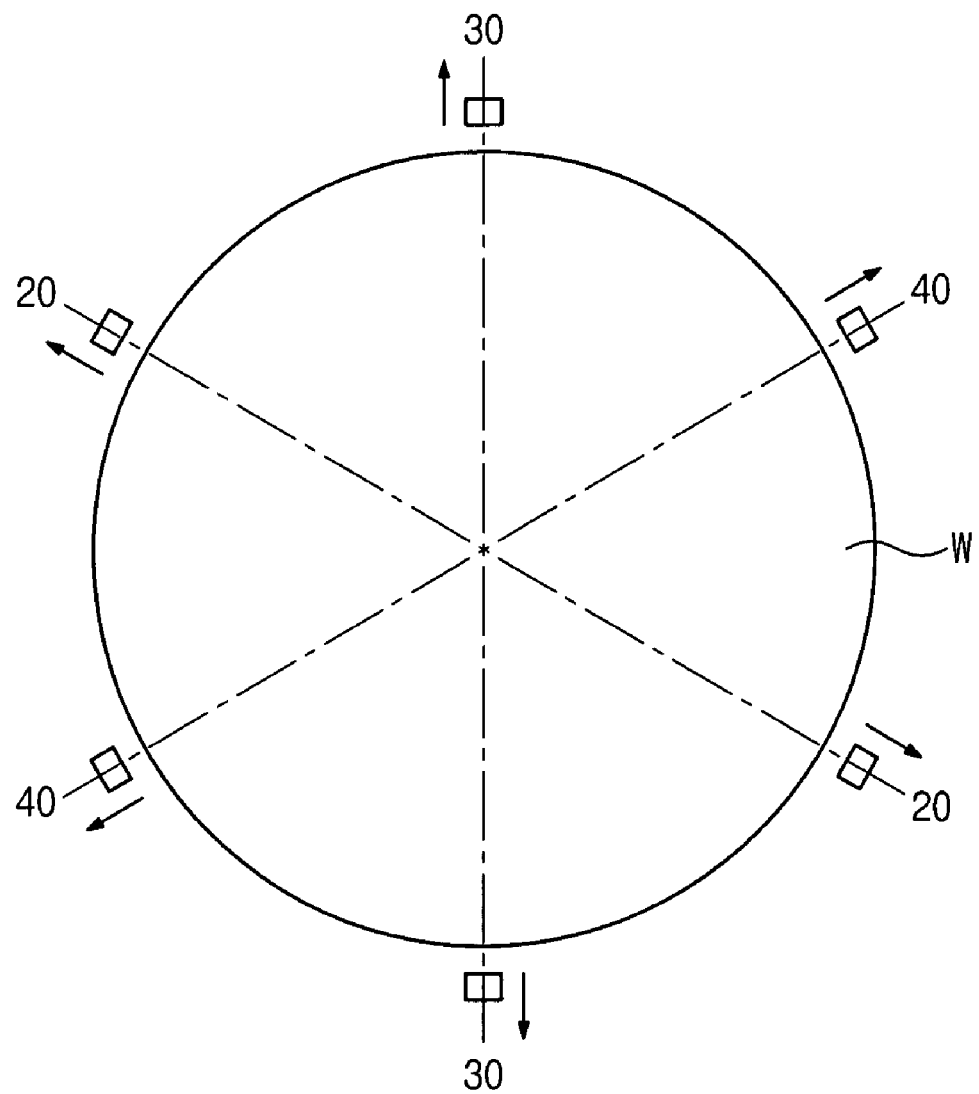

In FIGS. 5A and 5B, a magnetic force is applied to first to third sub-magnet 226, 326, and 426 by means of a driving magnet 500 according to the present invention. The configurations of first to third followers 220, 320, and 420 will be described below in detail with reference to FIG. 5A.

As previously stated, the driving unit includes a first follower 220, a second follower 320, and a third follower 420. Further, the driving unit includes a first magnet 224 disposed at the uppermost portion and a first sub-magnet 226 disposed at the lowermost portion, which are accommodated in a first housing 222.

More specifically, the first magnet 224 is disposed at a first height $h_1$ and the first sub-magnet 226 is disposed at a fourth height $h_4$, as illustrated in FIG. 5A.

The second follower 320 includes a second magnet 324 and a second sub-magnet 326, which are accommodated in a second housing 322. The second magnet 324 is disposed at a second height $h_2$, which is lower than the first magnet 224. The second sub-magnet 326 is disposed at a fourth height $h_4$, which is as high as the first sub-magnet 226.

The third follower 420 includes a third magnet 424 and a third sub-magnet 426, which are accommodated in a third housing 422. The third magnet 424 is disposed at a third height $h_3$, which is lower than the first and second magnet 224 and 324. The third sub-magnet 426 is disposed at a fourth height $h_4$, which is as high as the first and second sub-magnets 226 and 326.

The first to fourth heights $h_1$, $h_2$, $h_3$, and $h_4$ should be suitable to prevent a magnetic force from being applied to a magnet disposed at a different height from the driving magnetic substance 500. For example, when the driving magnet 500 is disposed at the second height $h_2$, the magnetic force of the driving magnet 500 should be applied only to the second magnet 324 disposed at the second height $h_2$ and should not be applied to the first magnet 224 disposed at the first height $h_1$ or the third magnet 424 disposed at the third height $h_3$.

In order to load a wafer W on the support plate 10, a larger space should be secured on the support plate 10 than the diameter of the wafer W. However, it is difficult to secure the larger space on the support plate 10 because the first to third chucking pins 20, 30, and 40 receive an elastic force in the radius inside direction of the support plate 10 when an external force is not applied. Hence, an external force should be applied in the radius outside direction of the support plate 10. Further, if the external force is stronger than the elastic force, the first to third chucking pins 20, 30, and 40 may travel in the radius outside direction of the support plate 10 and the larger space may be secured on the support plate 10.

The driving magnet 500 is disposed at the fourth height $h_4$ by means of the elevating member 600 to apply a magnetic force to the first to third sub-magnets 226, 326, and 426 (S10). When the driving magnet 500 is disposed at the fourth height $h_4$, a repulsive force is generated between the driving magnet 500 and each of the first to third sub-magnets 226, 326, and 426. The repulsive force offsets an elastic force and allows the first to third followers 220, 320, and 420 to travel in the radius outside direction of the support plate 10.

In order to enable a repulsive force to offset an elastic force, the repulsive force should be stronger than the elastic force. The intensity of the repulsive force may be experimentally selected by the intensity of a magnetic force generated between the driving magnet 500 and each of the first to third sub-magnets 226, 326, and 426 and a distance between the driving magnet 500 and each of the first to third followers 220, 320, and 420.

When the first to third followers 220, 320, and 420 travel in the radius outside direction of the support plate 10, the first to third chucking pins 20, 30, and 40 also travel in the radius outside direction of the support plate 10 to secure a space enough to load a wafer W on the support plate 10.

The wafer W is loaded on the support plate (S20). A support pin 14 is provided on the support plate 10 to support the bottom surface of the wafer W loaded on the support plate 10.

Figure 6B:
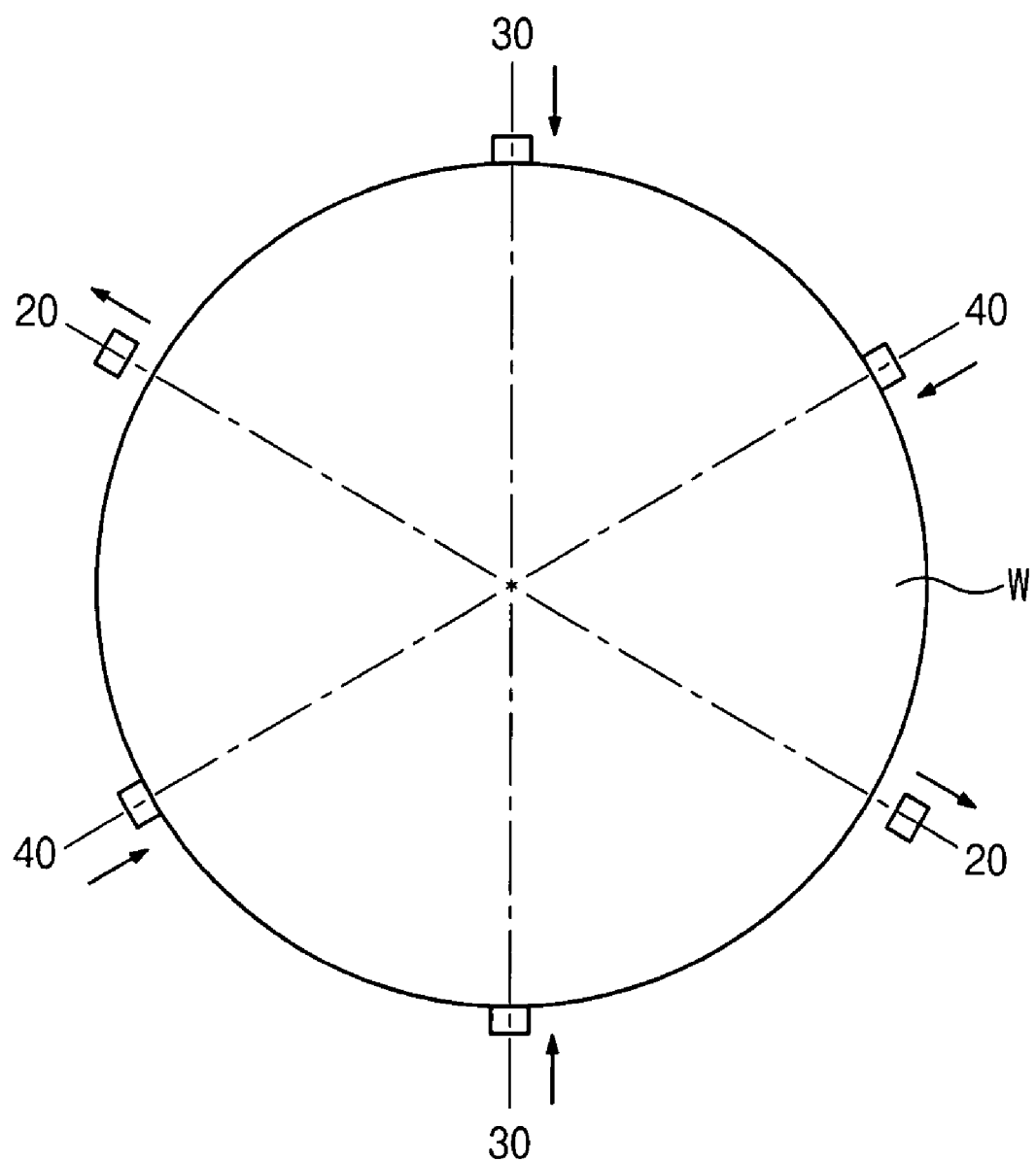

The driving magnet 500 is located at the first height $h_1$ by means of the elevating member 600 to apply a magnetic force to the first magnet 224 (S30). As illustrated in FIG. 6A, when the driving magnet 500 is located at the first height $h_1$, a repulsive force is generated between the driving magnet 500 and the first magnet 224 located at the first height $h_1$. The repulsive force offsets an elastic force and allows the first follower 220 to travel in the outside direction of radius of the support plate 10.

The driving magnet 500 is not capable of applying a magnetic force to the second and third magnets 324 and 424 which are disposed at the second and third heights $h_2$ and $h_3$, respectively. Thus, the second and third chucking pins 30 and 40 travels with the second and third followers 320 and 420 in the radius inside direction of the support plate 10 due to the elastic force. The second and third chucking pins 30 and 40 come in contact with a edge portion of the wafer W to support the wafer W.

Figure 7B:
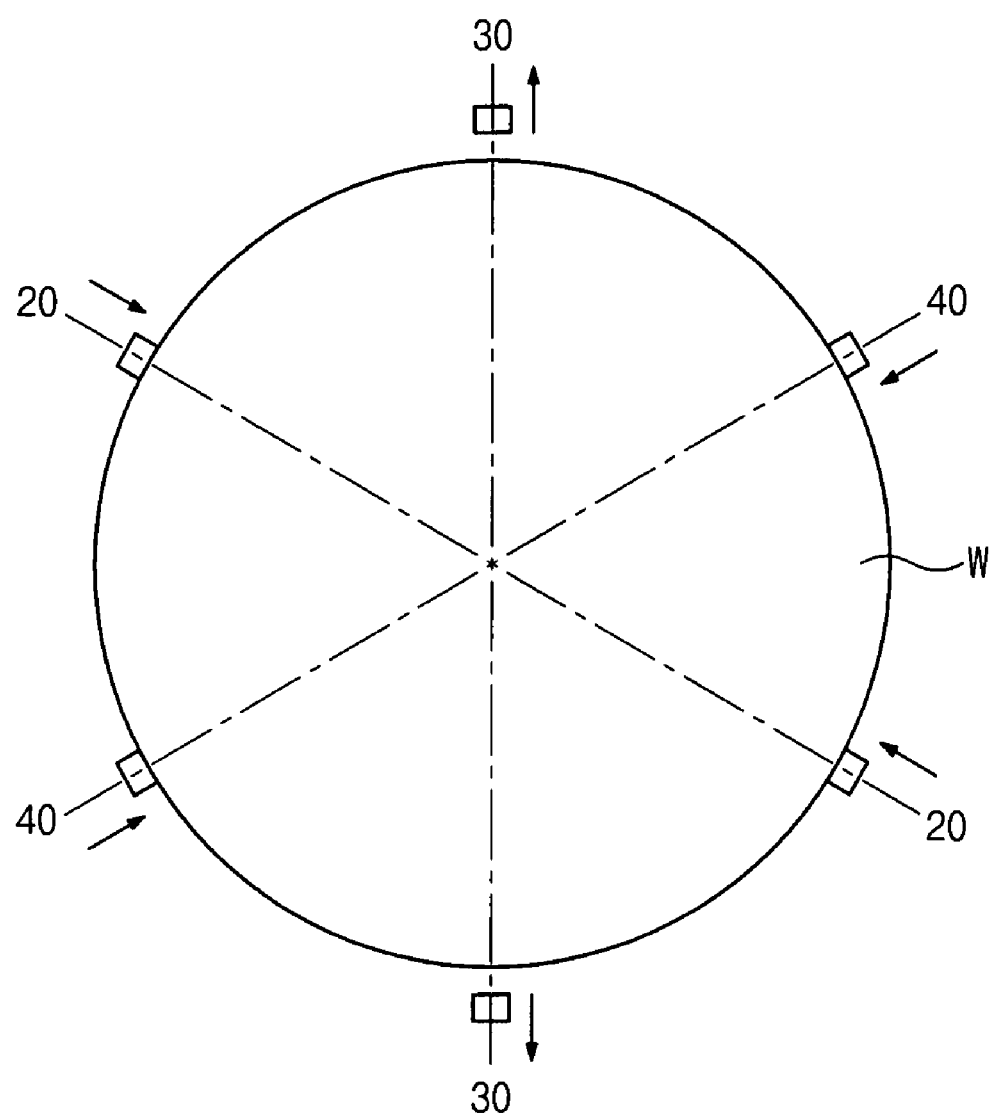
Figure 8B:
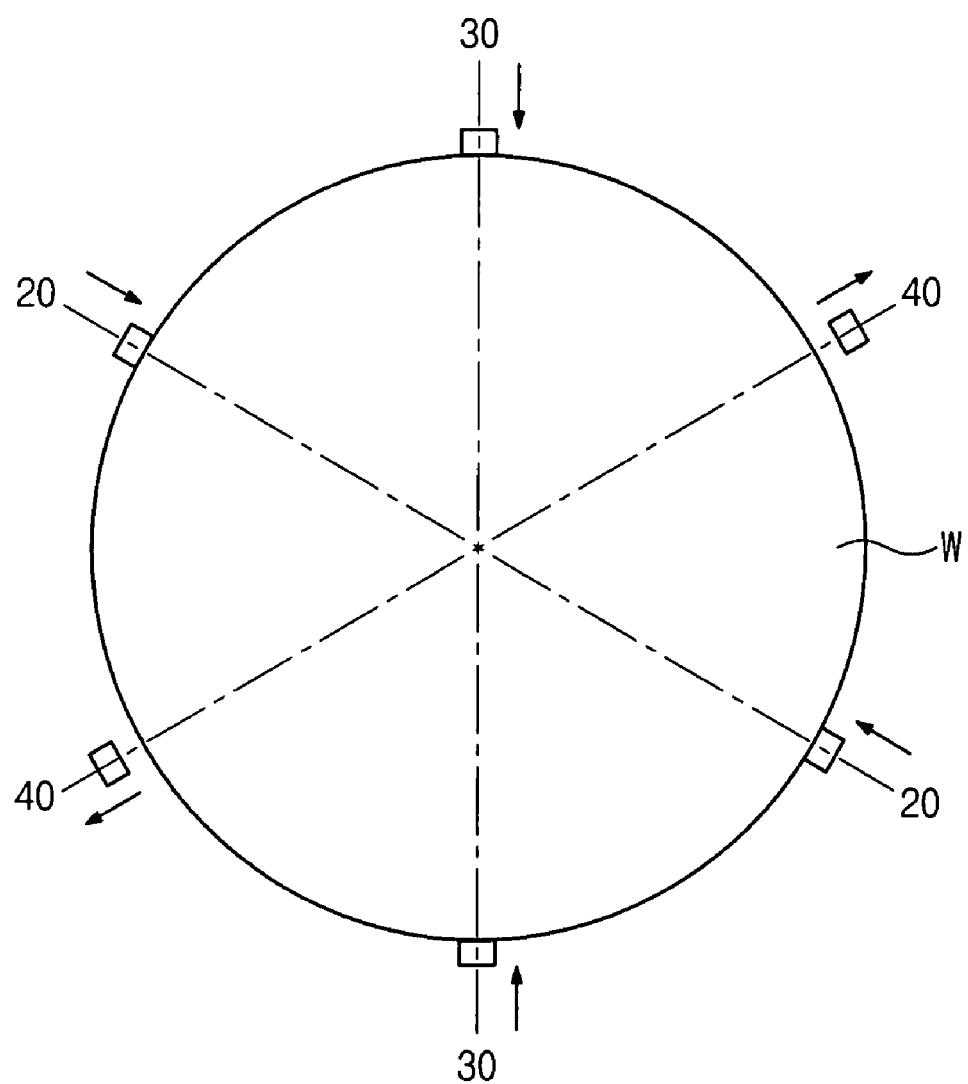

The driving magnet 500 is located at the second height $h_2$ by means of the elevating member 600 to apply a magnetic force to the second magnet 324 (S40). As illustrated in FIG. 7A, when the driving magnet 500 is located at the second height $h_2$, a repulsive force is generated between the driving magnet 500 and the second magnet 324 located at the second height $h_2$. The repulsive force offsets an elastic force and allows the second follower 320 to travel in the outside direction of radius of the support plate 10.

The driving magnet 500 is not capable of applying a magnetic force to the first and third magnets 224 and 424 which are disposed at the first and third heights $h_1$ and $h_3$, respectively. Thus, the first and third chucking pins 20 and 40 travels with the first and third followers 220 and 420 in the radius inside direction of the support plate 10 due to the elastic force. The first and third chucking pins 20 and 40 come in contact with a edge portion of the wafer W to support the wafer W.

The driving magnet 500 is located at the second height $h_3$ by means of the elevating member 600 to apply a magnetic force to the third magnet 424 (S50). As illustrated in FIG. 8A, when the driving magnet 500 is located at the third height $h_3$, a repulsive force is generated between the driving magnet 500 and the third magnet 424 located at the third height $h_3$. The repulsive force offsets an elastic force and allows the third follower 420 to travel in the outside direction of radius of the support plate 10.

The driving magnet 500 is not capable of applying a magnetic force to the first and second magnets 224 and 324 which are disposed at the first and second heights $h_1$ and $h_2$, respectively. Thus, the first and second chucking pins 20 and 30 travels with the first and second followers 220 and 320 in the radius inside direction of the support plate 10 due to the elastic force. The first and second chucking pins 20 and 30 come in contact with a edge portion of the wafer W to support the wafer W.

One of the first to third chucking pins 20, 30, and 40 provided to support the edge portion of the wafer W is separated from the edge portion of the wafer W, and the others are in contact with the edge portion of the wafer W. The first to third chucking pins 20, 30, and 40 are sequentially separated from the edge portion of the wafer W, which is repeated until the process is completed. At this point, if chemicals are supplied to a top surface of the wafer W while spinning the wafer W, they are prevented from remaining at portions which are in contact with the first to third chucking pins 20, 30, and 40.

When the above-described process is completed, the driving magnet 500 is located at the fourth height $h_4$ by means of the elevating member 600 to apply a magnetic force to the first to third sub-magnets 226, 326, and 426 (S60). When the driving magnet 500 is located at the fourth height $h_4$, a repulsive force is generated between the driving magnet 500 and each of the first to third sub-magnets 226, 326, and 426. The repulsive force offsets an elastic force and allows the first to third followers 220, 320, and 420 to travel in the radius outside direction of the support plate 10.

When the first to third followers 220, 320, and 420 travel in the radius outside direction of the support plate 10, the first to third chucking pins 20, 30, and 40 also travel in the radius outside direction of the support plate 10. Thus, the wafer W loaded on the support plate 10 may readily be unloaded therefrom.

As described above, the first to third sub-magnets 226, 326, and 426 are disposed at the fourth height $h_4$, which are lower than the first to third magnets 224, 324, and 424. However, the first to third sub-magnets 226, 326, and 426 may be disposed at a higher position than the first to third magnets 224, 324, and 424. Further, the heights of the first to third magnets 224, 324, and 424 are exchangeable with each other.

Figure 10:
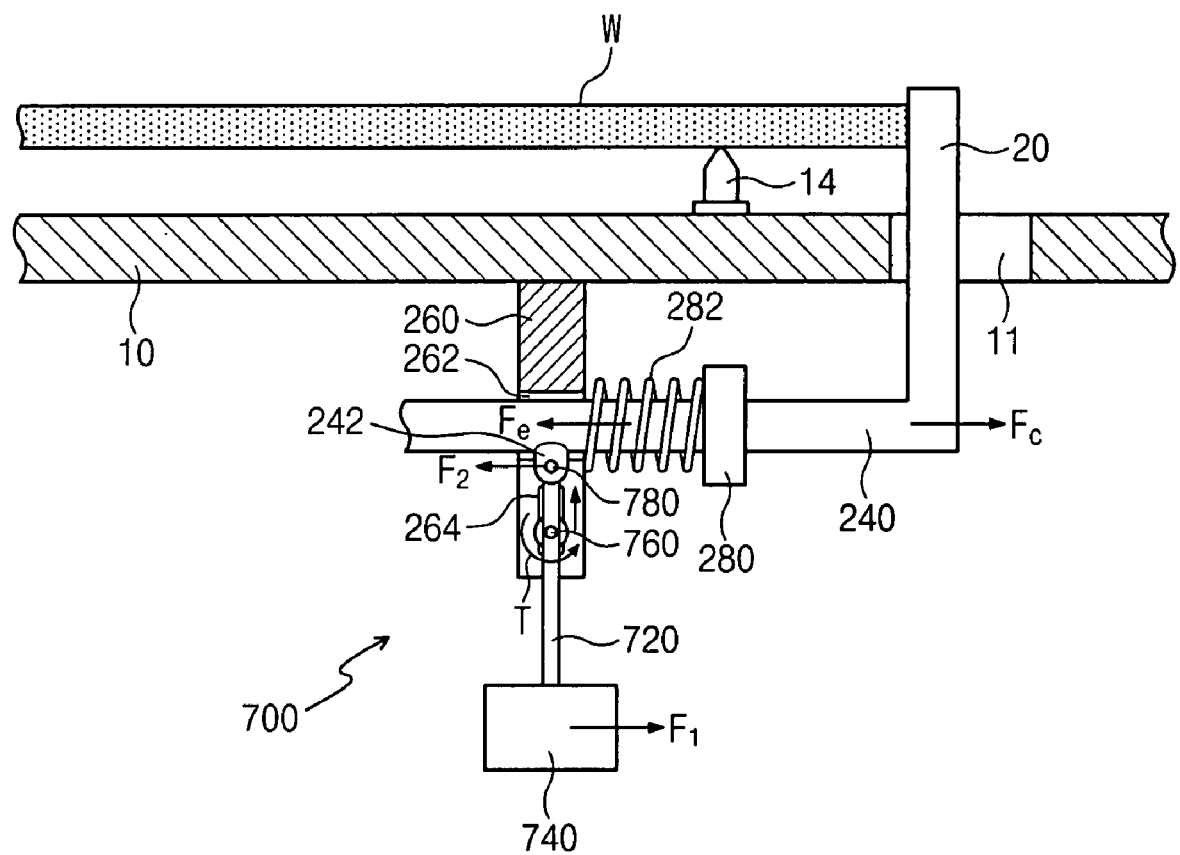
FIG. 10 illustrates the driving state of a safety unit according to the present invention.

FIG. 10 illustrates the driving state of a safety unit 700 according to the present invention. The safety unit 700 includes a rotating bar 720, a safety weight 740, a hinge 760, and a movable hinge 780. The safety unit 700 prevents the first chucking pin 20, which comes in contact with the edge portion of a wafer W due to the rotation of a support plate 10, from separating from the edge portion of the wafer W.

During a process, the support plate 10 is rotated by the rotation of a rotation shaft 12. Due to the rotation of the support plate 10, a centrifugal force is applied to a first chucking pin 20 provided to support a wafer W loaded on the support plate 10 and a first follower rod 240 connected to the first chucking pin 20. The force applied onto the first follower rod 240 is shown in FIG. 10.

An elastic force $F_e$ generated by a first elastic member 282 and a centrifugal force $F_c$ generated by the ration of the support plate 10 are applied to the first follower rod 240. The directions of the elastic force $F_e$ and the centrifugal force $F_c$ are opposite to each other. If the elastic force $F_e$ is stronger than the centrifugal force $F_c$, the centrifugal force $F_c$ is offset by the elastic force $F_e$ to prevent the first chucking pin 20 from separating from the wafer W. On the other hand, if the centrifugal force $F_c$ is stronger than the elastic force $F_e$, the centrifugal force $F_c$ is not offset by the elastic force $F_e$ to separate the first chucking pin 20 from the wafer W. Since the centrifugal force $F_c$ is proportional to revolution per minute (RPM), it becomes stronger when the support plate 10 rotates at a high speed. Due to the stronger centrifugal force $F_c$, the first chucking pin 20 may be separated from the wafer W.

A first protrusion 242 is provided to the first follower rod 240 disposed in a first guide hole 262. The first protrusion 242 protrudes perpendicularly from the first follower rod 240. One end of the rotation bar 720 is rotatably connected to the first protrusion 242 by means of the rotatable hinge 780.

The safety weight 740 is provided to the other end of the rotation bar 720. The safety weight 740 has a mass enough to prevent the first chucking pin 20 from separating from the wafer W even if a centrifugal force is applied.

A central portion of the rotation bar 720 is rotatably connected to a bottom portion of the first guide hole 262 of a first bush 260 by means of the hinge 760. The hinge 760 is movable up and down along a first guide groove 264 formed at the first bush 260, and the first follower rod 240 is freely movable in the radius direction of the support plate 10.

The operation of the safety unit 700 will now be described below with reference to FIG. 10.

As illustrated in FIG. 10, when the support plate 10 is rotated, a centrifugal force $F_1$ is applied to the safety weight 740. The centrifugal force $F_1$ acts in the radius outside direction of the support plate 10, causing a torque T around the hinge 760 to rotate the rotation bar 720 counterclockwise.

Due to the torque T, a resisting force $F_2$ is generated at one end of the rotation bar 720 connected to the first protrusion 242. The direction of the resisting force $F_2$ is opposite to that of the centrifugal force $F_1$. The resisting force $F_2$ acts in the radius inside direction of the support plate 10. The direction of the resisting force $F_2$ is opposite to not only that of the centrifugal force $F_1$ but also that of the centrifugal force $F_c$.

Thus, not only the centrifugal force $F_c$ and the elastic force $F_e$ but also the resisting force $F_2$ is applied to the first follower rod 240. Even if the centrifugal force $F_c$ is stronger than the elastic force $F_e$, it may be offset by the elastic force $F_e$ and the resisting force $F_2$. It is therefore possible to prevent the first chucking pin 20 from separating from the wafer W.

According to the present invention, chemicals remaining on the contact surface of a wafer can be removed and the entire surface of the wafer can be treated uniformly during a process. Moreover, it is possible to suppress process defects generated at the contact surface of a wafer and prevent a chucking pin from separating from the substrate even when a support plate is rotated.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A spin head, comprising:
    a rotatable support plate;
    first chucking pins and second chucking pins installed on a top surface of the rotatable support plate to support an edge portion of a substrate and prevent the substrate loaded on the rotatable support plate from separating from the rotatable support plate when the rotatable support plate rotates; and
    a driving unit for selectively moving the first and second chucking pins in an outside radial direction of the rotatable support plate via a magnetic force such that the first and second chucking pins are not in contact with the edge portion of the substrate during a process, the driving unit includes:
       first follower parts each including a first magnet which is connected to the first chucking pins and travels with the first chucking pin in a radial inside direction of the support plate by the magnetic force;
       second follower parts each including a second magnet which is connected to the second chucking pins and traveling with the second chucking pin in a radial inside direction of the support plate by the magnetic force;
       a driving magnet disposed inside the first and second follower parts; and an elevating member for selectively applying a magnetic force to the first magnet disposed at a first height and the second magnet disposed at a second height to elevate the driving magnet.

2. The spin head of claim 1, wherein one side of the respective first and second magnets opposite to the driving magnet has a same polarity as one side of the driving magnet.

3. The spin head of claim 1, further comprising:
third chucking pins installed on the top surface of the rotatable support plate and supporting the edge portion of the substrate,
wherein the driving unit further includes third follower parts each including a third magnet which is connected to the third chucking pin and travels with the third chucking pin in a radial inside direction of the rotatable support plate by the magnetic force, and the third magnetic is located at a third height which is different from the first height and the second height.

4. The spin head of claim 1, wherein the first follower part further includes a first sub-magnet disposed at a third height which is different from the first height and the second height, and the second follower part further includes a second sub-magnet disposed at the third height; and
wherein the driving magnet applies a magnetic force to the first and second sub-magnets to move the first and second chucking pins in the radial outside direction of the support plate at the same time.

5. The spin head of claim 1, wherein the driving unit further comprises:
a first elastic substance connected to the first chucking pin and providing an elastic force to the first chucking pin in the radial inside direction of the rotatable support plate; and
a second elastic substance connected to the second chucking pin and providing an elastic force to the second chucking pin the radial inside direction of the rotatable support plate,
wherein the driving magnet allows the first and second chucking pins to travel in the radial outside direction of the support plate.

6. The spin head of claim 1, wherein the first follower part comprises:
a first housing in which the first magnet is accommodated;
a first follower rod extending from the first chucking pin in the radial inside direction of the rotatable support plate and connecting the first chucking pin with the first housing;
a first bush fixed to a bottom surface of the rotatable support plate and guiding a travel direction of the first follower rod;
a first elastic substance connected to the first bush and providing an elastic force to the first follower rod in the radial inside direction of the rotatable support plate; and
a first fixture connected to the other end of the first elastic substance and fixed onto the first follower rod.

7. The spin head of claim 1, further comprising:
a safety unit provided to prevent the first or second chucking pin contacting the edge portion of the substrate from traveling in the radial outside direction of the rotatable support plate when the rotatable support plate is rotated.

8. The spin head of claim 7, wherein the safety unit comprises:
a first rotation bar having one end connected onto the first follower rod connected to the first chucking pin, the first rotation bar being rotatable;
a first safety weight connected to the other end of the first rotation bar;
a first hinge for fixing a center of the first rotation bar to prevent the center of the first rotation bar from moving in a radial inside direction of the rotatable support plate;
a second rotation bar having one end connected onto the second follower rod connected to the second chucking pin, the second rotation bar being rotatable;
a second safety weight connected to the other end of the second rotation bar; and
a second hinge for fixing a center of the second rotation bar to prevent the center of the second rotation bar from moving in the radial inside direction of the rotatable support plate,
wherein the first and second rotation bars rotate over the first and second hinges due to a centrifugal force generated by the rotation of the rotatable support plate; and
wherein one end of the respective first and second rotation bars moves in the radial inside direction of the rotatable support plate, and the other end of the respective first and second rotation bars moves in the radial outside direction of the rotatable support plate.

9. A spin head, comprising:
a rotatable support plate;
first chucking pins, second chucking pins, and third chucking pins installed on a top surface of the rotatable support plate and supporting an edge portion of a substrate to prevent the substrate loaded on the rotatable support plate from separating from the rotatable support plate when the rotatable support plate is rotated; and
a driving unit for moving the first to third chucking pins in a radial direction of the rotatable support plate such that the first to third chucking pins are in contact with or not in contact with the edge portion of the substrate,
wherein the driving unit allows one of the first to third chucking pins not to be in contact with the edge portion of the substrate by a magnetic force, the driving unit includes:
first follower parts each including a first magnet which is connected to the first chucking pin and travels with the first chucking pin in the radial direction of the rotatable support plate by the magnetic force;
second follower parts each including a second magnet which is connected to the second chucking pin and travels with the second chucking pin in the radial direction of the rotatable support plate by the magnetic force;
third follower parts each including a third magnet which is connected to the third chucking pin and travels with the third chucking pin in the radial direction of the rotatable support plate by the magnetic force;
a driving magnet disposed inside the first to third follower parts; and
an elevating member for elevating the driving magnet to selectively apply a magnetic force to the first magnet disposed at a first height, the second magnet disposed at a second height, and the third magnet disposed at a third height.

10. The spin head of claim 9, wherein one side of the respective first to third magnets opposite to the driving magnet has a same polarity as one side of the driving magnet opposite to the first to the third magnets.

11. A substrate treating method performed by providing a spin head including first and second chucking pins for supporting an edge portion of a substrate loaded on a support plate and a driving unit for moving the first and second chucking pins in a radial direction of the support plate and supplying a treating solution to the substrate loaded on the spin head, the substrate treating method comprising:

elevating a driving magnet of the driving unit to apply a magnetic force to a first magnet connected to the first chucking pins respectively, and the first chucking pins are spaced apart from the edge portion of the substrate by the magnetic force; and elevating the driving magnet to apply a magnetic force to a second magnet connected to the respective second chucking pins, respectively, and the second chucking pins are spaced apart from the edge portion of the substrate by the magnetic force, wherein the first magnet is disposed at a first height and the second magnet is disposed at a second height that is different from the first height, and applying the magnetic force to the first and second magnets are alternately repeated by the elevation of the driving magnet.

12. The substrate treating method of claim 11, further comprising:

loading/unloading the substrate on/from the support plate while applying a magnetic force to first sub-magnets connected to the first chucking pins respectively and second sub-magnets connected to the second chucking pins respectively to move the first and second chucking pins in the radial direction of the support plate at the same time.

13. The substrate treating method of claim 12, wherein one side of the respective first and second sub-magnets opposite to the driving magnet has a same polarity as one side of the driving magnet opposite to the first and second sub-magnet.

14. The substrate treating method of claim 11, wherein the spin head further includes third chucking pins configured to support the edge portion of the substrate, the substrate treating method further comprising:

elevating the driving magnet to apply a magnetic force to third magnets connected to the third chucking pins respectively, and the third chucking pins are spaced apart from the edge portion of the substrate by the magnetic force, wherein the third magnet is disposed at a third height that is different from the first height and the second height, and applying the magnetic force to the first to the third magnets are sequentially repeated by the elevation of the driving magnet.

15. A substrate treating method, comprising:

supporting an edge portion of a substrate loaded on a support plate via first chucking pins, second chucking pins, and third chucking pins during a process, elevating a driving magnet of a driving unit to apply a magnetic force to a first magnet connected to the first chucking pins, respectively; and elevating the driving magnet to apply a magnetic force to a second magnet connected to the respective second chucking pins, respectively, wherein the first magnet is disposed at a first height and the second magnet is disposed at a second height that is different from the first height, and wherein one of the first to third chucking pins is not in contact with the edge portion of the substrate and the others are in contact therewith, and one of the first to third chucking pins not being in contact with the edge portion of the substrate is alternately selected.

* * * * *